(12) United States Patent
Ko

(10) Patent No.: US 11,888,065 B2
(45) Date of Patent: *Jan. 30, 2024

(54) THIN FILM TRANSISTOR ARRAY SUBSTRATE AND ELECTRONIC DEVICE INCLUDING THE SAME

(71) Applicant: LG Display Co., Ltd., Seoul (KR)

(72) Inventor: Younghyun Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/975,366

(22) Filed: Oct. 27, 2022

(65) Prior Publication Data

US 2023/0061581 A1 Mar. 2, 2023

Related U.S. Application Data

(63) Continuation of application No. 17/115,582, filed on Dec. 8, 2020, now Pat. No. 11,515,425.

(30) Foreign Application Priority Data

Dec. 20, 2019 (KR) .......................... 10-2019-0171760

(51) Int. Cl.
*H01L 29/786* (2006.01)
(52) U.S. Cl.
CPC .. *H01L 29/78603* (2013.01); *H01L 29/78696* (2013.01)
(58) Field of Classification Search
CPC ......... H01L 29/78603; H01L 29/78696; H01L 27/1225; H01L 27/1222; H01L 29/78648;
(Continued)

(56) References Cited

U.S. PATENT DOCUMENTS 6,627,953 B1 9/2003 Vu et al.
10,468,477 B2 11/2019 Jung et al.
(Continued)

FOREIGN PATENT DOCUMENTS

KR 10-2018-0047540 A 5/2018
KR 10-2019-0079828 A 7/2019

OTHER PUBLICATIONS

United States Office Action, U.S. Appl. No. 17/115,582, dated Apr. 25, 2022, 11 pages.
(Continued)

*Primary Examiner* — Tong-Ho Kim
(74) *Attorney, Agent, or Firm* — Fenwick & West LLP

(57) ABSTRACT

Provided are a thin film transistor army substrate and an electronic device including the same. The thin film transistor army substrate includes a first active layer disposed on a substrate, a first gate insulating film disposed on the first active layer, a first gate electrode disposed on the first gate insulating film to overlap a part of the first active layer, a first insulating film disposed on the first gate electrode, a second active layer disposed on the first insulating film to overlap the first active layer and the first gate electrode, a second gate insulating film disposed on the second active layer, and a second gate electrode disposed on the second gate insulating film to overlap a part of the second active layer. The first gate electrode and the second gate electrode overlap each other, and thus it is possible to reduce an area occupied by transistors.

18 Claims, 18 Drawing Sheets

(58) Field of Classification Search
CPC ........... H01L 29/41733; G02F 1/13306; G02F 1/1362; H10K 59/1213
USPC ........................................................ 257/288
See application file for complete search history.

(56) References Cited

U.S. PATENT DOCUMENTS

| | | |
|---|---|---|
| 11,515,425 B2* | 11/2022 | Ko ..................... H01L 27/1225 |
| 2018/0122832 A1* | 5/2018 | Lee ................... G02F 1/133345 |
| 2018/0122888 A1 | 5/2018 | Jung et al. |
| 2018/0144685 A1 | 5/2018 | Gong et al. |
| 2018/0233575 A1 | 8/2018 | Kim et al. |

OTHER PUBLICATIONS

Korean Intellectual Property Office, Office Action, Korean Patent Application No. 10-2019-0171760, dated Oct. 23, 2023, 21 pages.

\* cited by examiner

THIN FILM TRANSISTOR ARRAY SUBSTRATE AND ELECTRONIC DEVICE INCLUDING THE SAME

CROSS REFERENCE TO RELATED APPLICATIONS

This application is a continuation application of U.S. application Ser. No. 17/115,582, filed on Dec. 8, 2020, which claims priority from Republic of Korea Patent Application No. 10-2019-0171760, filed on Dec. 20, 2019, all of which are hereby incorporated by reference for all purposes as if fully set forth herein.

BACKGROUND

1. Field

Embodiments of the present disclosure relate to a thin film transistor (TFT) array substrate and an electronic device including the same.

2. Description of the Prior Art

With the development of an information society, demands for various electronic devices, such as display devices and light fixtures, are increasing in various forms. Such an electronic device may include a panel in which data lines and gate lines are disposed, a data driver for driving the data lines, and a gate driver for driving the gate lines.

In the panel which is the core of the electronic device, numerous transistors for various functions may be disposed to drive the panel.

For this reason, a panel manufacturing process is complicated and difficult to manage. Accordingly, pursuing the convenience of a process may cause degradation in the device performance of transistors.

Also, the degree of integration of transistors is increased to achieve excellent characteristics, such as high resolution, of an electronic device. However, due to the problems in a fabrication process, design, etc., it is not possible to limitlessly reduce the size of transistors. Consequently, it is necessary to provide a transistor having a structure which allows an electronic device to be highly integrated without degrading characteristics of the transistor.

SUMMARY

Embodiments of the present disclosure are directed to providing a thin film transistor (TFT) array substrate, which has a structure in which an area occupied by transistors is reduced by stacking at least two transistors on a substrate in a direction perpendicular to the substrate, and an electronic device including the TFT array substrate.

Also, embodiments of the present disclosure are directed to providing a TFT array substrate, which has a structure in which the gate electrodes of at least two transistors are connected to nodes corresponding to each other so that a leakage current can be reduced, and an electronic device including the TFT array substrate.

Also, embodiments of the present disclosure are directed to providing a TFT array substrate, which has a structure in which a contact hole formed for an electrical connection between elements included in at least two transistors overlapping each other is properly disposed to prevent damage to the elements included in the transistors during the fabrication process, and an electronic device including the TFT array substrate.

In accordance with an aspect of the present disclosure, there is provided an electronic device including a panel and a driving circuit for driving the panel. A transistor disposed in the panel includes a first active layer disposed on a substrate, a first gate insulating film disposed on the first active layer to overlap a part of the first active layer, a first gate electrode disposed on the first gate insulating film to overlap a part of the first active layer, a first insulating film disposed on the first gate electrode, a second active layer disposed on the first insulating film to overlap the first active layer and the first gate electrode, a second gate insulating film disposed on the second active layer, and a second gate electrode disposed on the second gate insulating film to overlap a part of the second active layer. The first gate electrode and the second gate electrode overlap each other.

In accordance with an aspect of the present disclosure, there is provided a TFT array substrate including a substrate, a first active layer disposed on the substrate, a first gate insulating film disposed on the first active layer, a first gate electrode disposed on the first gate insulating film to overlap a part of the first active layer, a first insulating film disposed on the first gate electrode, a second active layer disposed on the first insulating film to overlap the first active layer and the first gate electrode, a second gate insulating film disposed on the second active layer, and a second gate electrode disposed on the second gate insulating film to overlap a part of the second active layer. The first gate electrode and the second gate electrode overlap each other.

According to embodiments of the present disclosure, it is possible to provide a TFT array substrate, which has a structure in which an area occupied by transistors can be reduced by stacking at least two transistors on a substrate in a direction perpendicular to the substrate, and an electronic device including the TFT array substrate.

According to embodiments of the present disclosure, it is possible to provide a TFT army substrate, which has a structure in which gate electrodes of at least two transistors are connected to nodes corresponding to each other so that a leakage current can be reduced, and an electronic device including the TFT array substrate.

According to embodiments of the present disclosure, it is possible to provide a TFT array substrate, which has a structure in which a contact hole formed for an electrical connection between elements included in at least two transistors overlapping each other is properly disposed to prevent damage to the elements included in the transistors during the fabrication process, and an electronic device including the TFT array substrate.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
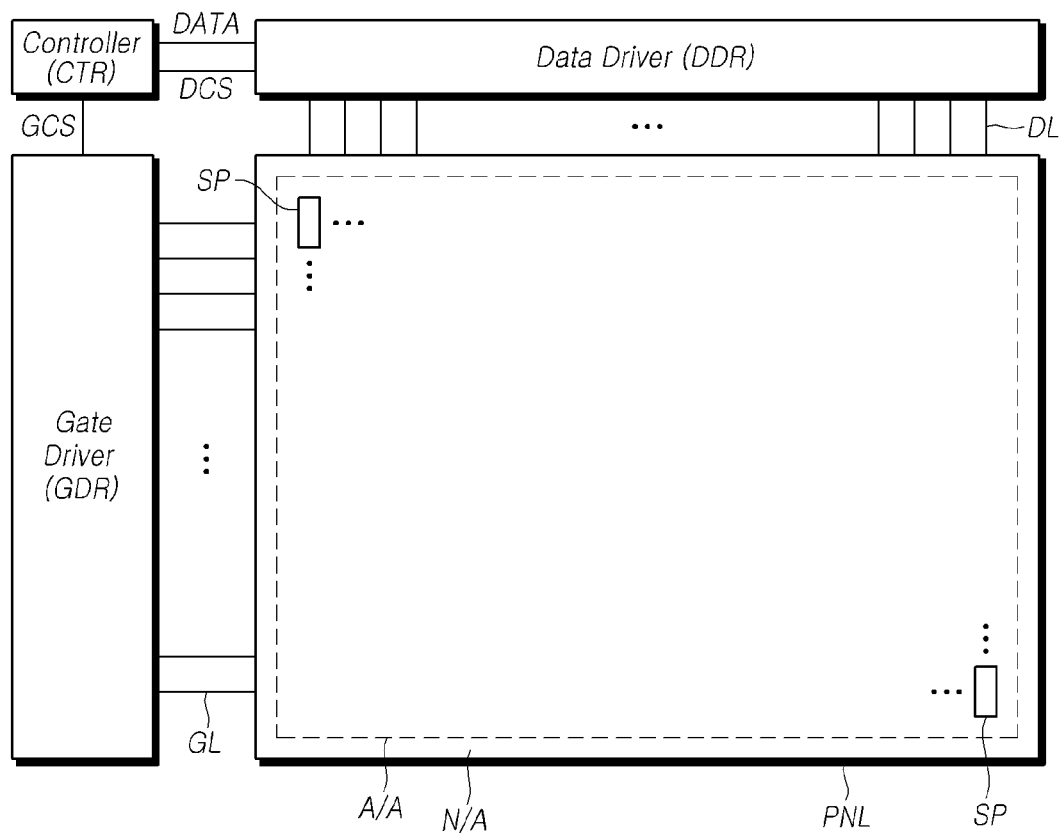
FIG. 1 is a diagram schematically illustrating a configuration of an electronic device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element may be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a diagram schematically illustrating a configuration of an electronic device according to embodiments of the present disclosure.

The electronic device according to the embodiments of the present disclosure may include a display device, a light fixture, a light-emitting device, and the like. For convenience of description, the display device will be mainly described below. However, the present disclosure may be applied to various other electronic devices, such as a light fixture and a light-emitting device, in the same way as long as a transistor is included.

The electronic device according to the embodiments of the present disclosure may include a panel PNL for displaying an image or outputting light and a driving circuit for driving the panel PNL.

In the panel PNL, a plurality of data lines DL and a plurality of gate lines GL may be disposed, and a plurality of subpixels SP defined by the plurality of data lines DL and the plurality of gate lines GL may be arranged in a matrix form.

In the panel PNL, the plurality of data lines DL and the plurality of gate lines GL may be arranged to intersect. For example, the plurality of gate lines GL may be arranged in rows or columns, and the plurality of data lines DL may be arranged in columns or rows. For convenience of description, it is assumed below that the plurality of gate lines GL are disposed in rows and the plurality of data lines DL are disposed in columns.

In the panel PNL, in addition to the plurality of data lines DL and the plurality of gate lines GL, other kinds of signal lines may be disposed according to a subpixel structure and the like. Driving voltage lines, reference voltage lines, common voltage lines, or the like may be additionally disposed.

The panel PNL may be one of various types of panels such as a liquid crystal display (LCD) panel and an organic light-emitting diode (OLED) panel.

The types of signal lines disposed in the panel PNL may vary depending on a subpixel structure, a panel type (e.g., an LCD panel or an OLED panel), and the like. In this specification, signal lines may include electrodes to which signals are applied.

The panel PNL may include an active region A/A in which a video (image) is displayed and a non-active region (N/A) which is an outer region of the active region A/A and in which a video (image) is not displayed. The non-active region N/A may also be referred to as a "bezel region."

In the active region A/A, a plurality of subpixels SP for video display are disposed.

In the non-active region N/A, a pad section to which a data driver DDR is electrically connected may be disposed, and a plurality of data link lines for connecting the pad section and the plurality of data lines DL may also be disposed. The plurality of data link lines may be parts of the plurality of data lines DL extending to the non-active region N/A or additional patterns electrically connected to the plurality of data lines DL.

In the non-active region N/A, gate driving-related lines may be disposed to transfer a voltage (a signal) required for gate driving to a gate driver GDR through the pad section to which the data driver DDR is electrically connected. For example, the gate driving-related lines may include clock lines for transferring a clock signal, gate voltage lines for transferring gate voltages VGH and VGL, gate-driving control signal lines for transferring various control signals required for generating scan signals, and the like. These gate driving-related lines are disposed in the non-active region N/A unlike the gate lines GL disposed in the active region A/A.

The driving circuit may include the data driver DDR for driving the plurality of data lines DL, the gate driver GDR for driving the plurality of gate lines GL, a controller CTR for controlling the data driver DDR and the gate driver GDR, and the like.

The data driver DDR may drive the plurality of data lines DL by outputting data voltages to the plurality of data lines DL.

The gate driver GDR may drive the plurality of gate lines GL by outputting scan signals to the plurality of gate lines GL.

The controller CTR may control an operation of driving the data driver DDR and the gate driver GDR by supplying various control signals DCS and GCS required for the operation of driving the data driver DDR and the gate driver GDR. Also, the controller CTR may supply image data DATA to the data driver DDR.

The controller CTR begins scanning according to the timing of each frame, converts input image data, which is input from the outside of the electronic device, into a data signal format used in the data driver DDR to output converted image data DATA, and controls data driving at an appropriate time for scanning.

To control the data driver DDR and the gate driver GDR, the controller CTR receives timing signals, such as a vertical synchronization signal Vsync, a horizontal synchronization signal Hsync, an input data enable (DE) signal, and a clock signal CLK, from the outside (e.g., a host system) and generates and outputs various control signals to the data driver DDR and the gate driver GDR.

For example, to control the gate driver GDR, the controller CTR outputs various gate control signals (GCSs) including a gate start pulse (GSP), a gate shift clock (GSC), a gate output enable (GOE) signal, and the like.

Also, to control the data driver DDR, the controller CTR outputs various data control signals (DCSs) including a source start pulse (SSP), a source sampling clock (SSC), a source output enable (SOE) signal, and the like.

The controller CTR may be a timing controller used in general display technology or a control device which may perform other control functions in addition to those of a timing controller.

The controller CTR may be implemented as a component separate from the data driver DDR or integrated with the data driver DDR into an integrated circuit.

The data driver DDR receives the image data DATA from the controller CR and supplies data voltages to the plurality of data lines DL, thereby driving the plurality of data lines DL. The data driver DDR is also referred to as "source driver."

The data driver DDR may transmit various signals to the controller CTR and receive various signals from the controller CTR through various interfaces.

The gate driver GDR sequentially drives the plurality of gate lines GL by sequentially supplying scan signals to the plurality of gate lines GL. The gate driver GDR is also referred to as "scan driver."

The gate driver GDR sequentially supplies scan signals having an on-voltage or an off-voltage to the plurality of gate lines GL under the control of the controller CTR.

When a specific gate line is activated by the gate driver GDR, the data driver DDR converts the image data DATA received from the controller CTR into analog data voltages and supplies the analog data voltages to the plurality of data lines DL.

The data driver DDR may be disposed on only one side (e.g., the upper side or the lower side) of the panel PNL or disposed on both sides (e.g., the upper side and the lower side) of the panel PNL according to a driving method, a panel design, etc. in some cases.

The gate driver GDR may be disposed on only one side (e.g., the left side or the right side) of the panel PNL or disposed on both sides (e.g., the left side and the right side) of the panel PNL according to a driving method, a panel design, etc. in some cases.

The data driver DDR may include one or more source driver integrated circuits SDIC.

Each of the source driver integrated circuits SDIC may include a shift register, a latch circuit, a digital-to-analog converter (DAC), an output buffer, and the like. The data driver DDR may further include one or more analog-to-digital converters (ADCs) in some cases.

Each of the source driver integrated circuits SDIC is a tape automated bonding (TAB) type or chip-on-glass (COG) type of source driver integrated circuit SDIC and may be connected to a bonding pad of the panel PNL or disposed directly on the panel PNL. In some cases, each of the source driver integrated circuits SDIC may be integrated with the panel PNL. Also, each of the source driver integrated circuits SDIC may be implemented as a chip-on-film (COF) type. In this case, each of the source driver integrated circuits SDIC may be mounted on a circuit film and connected to data lines DL in the panel PNL through the circuit film.

The gate driver GDR may include a plurality of gate driving circuits GDC. Each of the plurality of gate driving circuits GDC may correspond to one of the plurality of gate lines GL.

Each of the gate driving circuits GDC may include a shift register, a level shifter, and the like.

Each of the gate driving circuits GDC is a TAB type or COG type of gate driving circuit and may be connected to the bonding pad of the panel PNL. Also, each of the gate driving circuits GDC may be implemented as a COF type. In this case, each of the gate driving circuits GDC may be mounted on the circuit film and electrically connected to gate lines GL in the panel PNL through the circuit film. Also, each of the gate driving circuits GDC may be implemented as a gate-in-panel (GIP) type and embedded in the panel PNL. In other words, each of the gate driving circuits GDC may be formed directly in the panel PNL.

Figure 2:
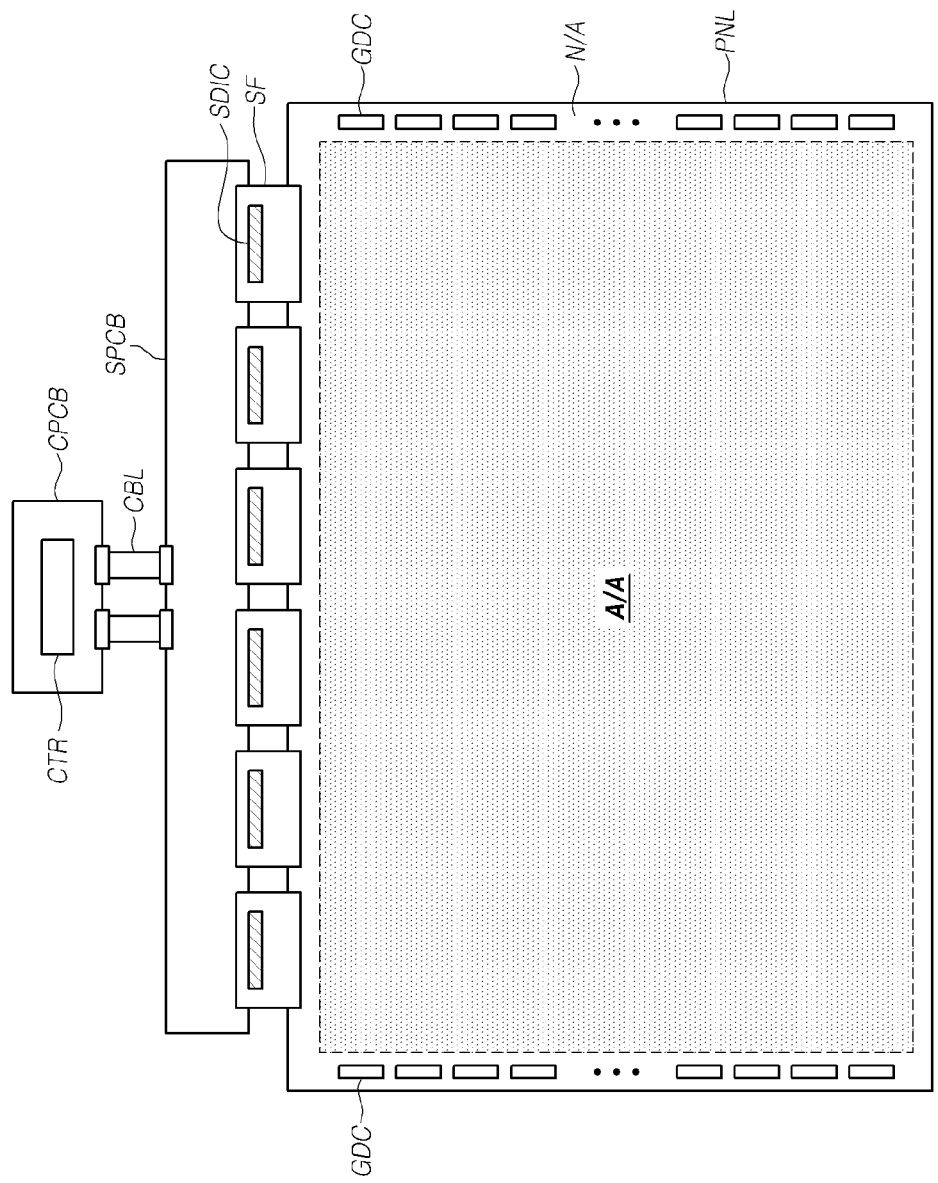
FIG. 2 shows an implementation example of an electronic device according to the embodiments of the present disclosure.

FIG. 2 shows an implementation example of an electronic device according to the embodiments of the present disclosure.

Referring to FIG. 2, in the electronic device according to the embodiments of the present disclosure, the data driver DDR may be implemented as a COF type among various types (TAB, COG, COF, etc.), and the gate driver GDR may be implemented as a GIP type among various types (TAB, COG, COF, GIP, etc.).

The data driver DDR may be implemented as one or more source driver integrated circuits SDIC. FIG. 2 shows an example in which the data driver DDR is implemented as a plurality of source driver integrated circuits SDIC.

When the data driver DDR is implemented as a COF type, each of the source driver integrated circuits SDIC for implementing the data driver DDR may be mounted on source-side circuit films SF.

One sides of the source-side circuit films SF may be electrically connected to the pad section (a set of pads) present in the non-active region N/A.

On the source-side circuit films SF, lines may be disposed to electrically connect the source driver integrated circuits SDIC to the panel PNL.

For circuit connections between the plurality of source driver integrated circuits SDIC and other devices, the electronic device may include at least one source printed circuit board SPCB and a control printed circuit board CPCB for mounting control parts and various electrical devices.

The other sides of the source-side circuit films SF on which the source driver integrated circuits SDIC are mounted may be connected to the at least one source printed circuit board SPCB.

In other words, the one sides of the source-side circuit films SF on which the source driver integrated circuits SDIC are mounted may be electrically connected to the non-active region N/A of the panel PNL, and the other sides thereof may be electrically connected to the source printed circuit board SPCB.

On the control printed circuit board CPCB, the controller CIR for controlling operation of the data driver DDR, the gate driver GDR, etc. may be disposed.

Also, a power management integrated circuit (IC) PMIC and the like may be additionally disposed on the control printed circuit board CPCB to supply various voltages or currents to the panel PNL, the data driver DDR, the gate driver GDR, etc. or control the various voltages or currents to be supplied thereto.

The source printed circuit board SPCB and the control printed circuit board CPCB may be connected through at least one connecting member CBL in a circuit. As an example, the connecting member CBL may be a flexible printed circuit (FPC), a flexible flat cable (FFC), or the like.

The at least one source printed circuit board SPCB and the control printed circuit board CPCB may be integrated into one printed circuit board.

When the gate driver GDR is implemented as a GIP type, the plurality of gate driving circuits GDC included in the gate driver GDR may be formed directly on the non-active region N/A of the panel PNL.

Each of the plurality of gate driving circuits GDC may output a corresponding scan signal SCAN to a corresponding gate line GL disposed in the active region A/A of the panel PNL.

The plurality of gate driving circuits GDC disposed on the panel PNL may be supplied with various signals required for generating scan signals (a clock signal, a high-level gate voltage VGH, a low-level gate voltage VGL, a start signal VST, a reset signal RST, etc.) through the gate driving-related lines disposed in the non-active region N/A.

The gate driving-related lines disposed in the non-active region N/A may be electrically connected to source-side circuit films SF disposed closest to the plurality of gate driving circuits GDC.

Figure 3:
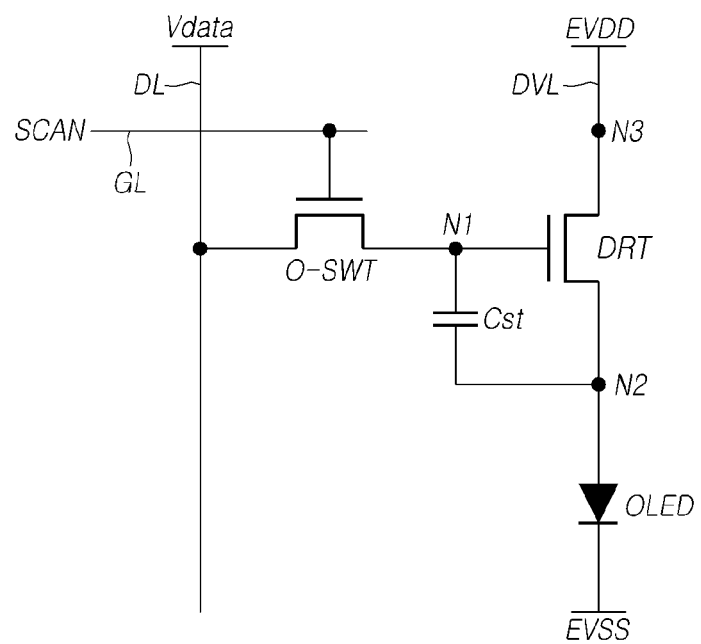
FIG. 3 shows a structure of a subpixel when a panel according to the embodiments of the present disclosure is an organic light-emitting diode (OLED) panel.

FIG. 3 shows a structure of a subpixel SP when the panel PNL according to the embodiments of the present disclosure is an OLED panel.

Referring to FIG. 3, in the panel PNL which is an OLED panel, each subpixel SP may include an organic light-emitting diode OLED, a driving transistor DRT for driving the organic light-emitting diode OLED, a switching transistor O-SWT electrically connected between a first node N1 of the driving transistor DRT and a corresponding data line DL, a storage capacitor Cst electrically connected between the first node N1 and a second node N2 of the driving transistor DRT, and the like.

The organic light-emitting diode OLED may include an anode, an organic light-emitting layer, a cathode, and the like.

According to the circuit example of FIG. 3, the anode (also referred to as "pixel electrode") of the organic light-emitting diode OLED may be electrically connected to the second node N2 of the driving transistor DRT. A base voltage EVSS may be applied to the cathode (also referred to as "common electrode") of the organic light-emitting diode OLED.

As an example, the base voltage EVSS may be a ground voltage or a higher or lower voltage than the ground voltage. Also, the base voltage EVSS may vary depending on a driving state. For example, the base voltage EVSS for an image operation may be set differently from that for a sensing operation.

The driving transistor DRT drives the organic light-emitting diode OLED by supplying a driving current to the organic light-emitting diode OLED.

The driving transistor DRT may include the first node N1, the second node N2, a third node N3, and the like.

The first node N1 of the driving transistor DRT may be the gate node and electrically connected to the source node or the drain node of the switching transistor O-SWT. The second node N2 of the driving transistor DRT may be the source node or the drain node and electrically connected to the anode (or the cathode) of the organic light-emitting diode OLED. The third node N3 of the driving transistor DRT may be the drain node or the source node. A driving voltage EVDD may be applied to the third node N3, and the third node N3 may be electrically connected to a driving voltage line DVL which supplies the driving voltage EVDD.

The storage capacitor Cst may be electrically connected between the first node N1 and the second node N2 of the driving transistor DRT and maintain a data voltage Vdata corresponding to an image signal voltage or a voltage corresponding to the data voltage Vdata for one frame time (or a determined time).

The drain node or the source node of the switching transistor O-SWT may be electrically connected to the corresponding data line DL, the source node or the drain node of the switching transistor O-SWT may be electrically connected to the first node N1 of the driving transistor DRT, and the gate node of the switching transistor O-SWT may be electrically connected to a corresponding gate line and receive a scan signal SCAN.

The switching transistor O-SWT may receive the scan signal SCAN through the corresponding gate line so that turning the switching transistor O-SWT on or off may be controlled.

The switching transistor O-SWT may be turned on by the scan signal SCAN and transfer the data voltage Vdata supplied through the corresponding data line DL to the first node N1 of the driving transistor DRT.

Meanwhile, the storage capacitor Cst may be an external capacitor, which is intentionally designed outside the driving transistor DRT, rather than a parasitic capacitor (e.g., Cgs or Cgd), which is an internal capacitor present between the first node N1 and the second node N2 of the driving transistor DRT.

Each of the driving transistor DRT and the switching transistor O-SWT may be an n-type transistor or a p-type transistor.

The subpixel structure illustrated in FIG. 3 is a two-transistor one-capacitor (2T1C) structure and is only an example for description. Each subpixel structure may further include one or more transistors or further include one or more capacitors in some cases. Alternatively, each of the plurality of subpixels may have the same structure, or some of the plurality of subpixels may have another structure.

Figure 4:
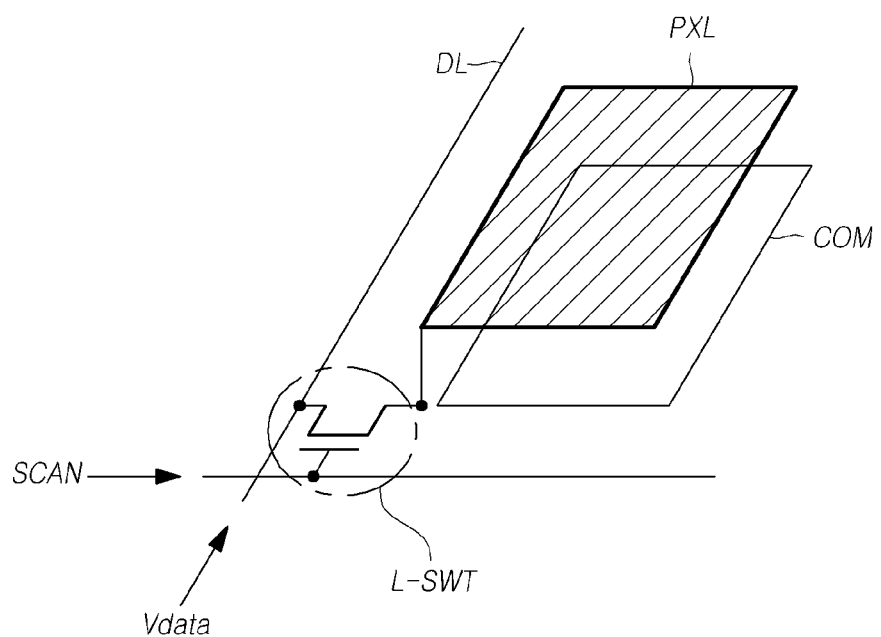
FIG. 4 shows a structure of a subpixel when a panel according to the embodiments of the present disclosure is a liquid crystal display (LCD) panel.

FIG. 4 shows a structure of a subpixel SP when the panel PNL according to the embodiments of the present disclosure is an LCD panel.

Referring to FIG. 4, each subpixel SP in the panel PNL, which is an LCD panel, may include a pixel electrode PXL, a switching transistor L-SWT, and the like.

The switching transistor L-SWT may be controlled by the scan signal SCAN and electrically connected between a data line DL and the pixel electrode PXL.

The switching transistor L-SWT is turned on by the scan signal to transfer the data voltage Vdata supplied through the data line DL to the pixel electrode PXL. The pixel electrode PXL to which the data voltage Vdata is applied may form an electric field together with a common electrode COM to which a common voltage is applied. In other words, a capacitor (a storage capacitor) may be formed between the pixel electrode PXL and the common electrode COM.

Figure 5:
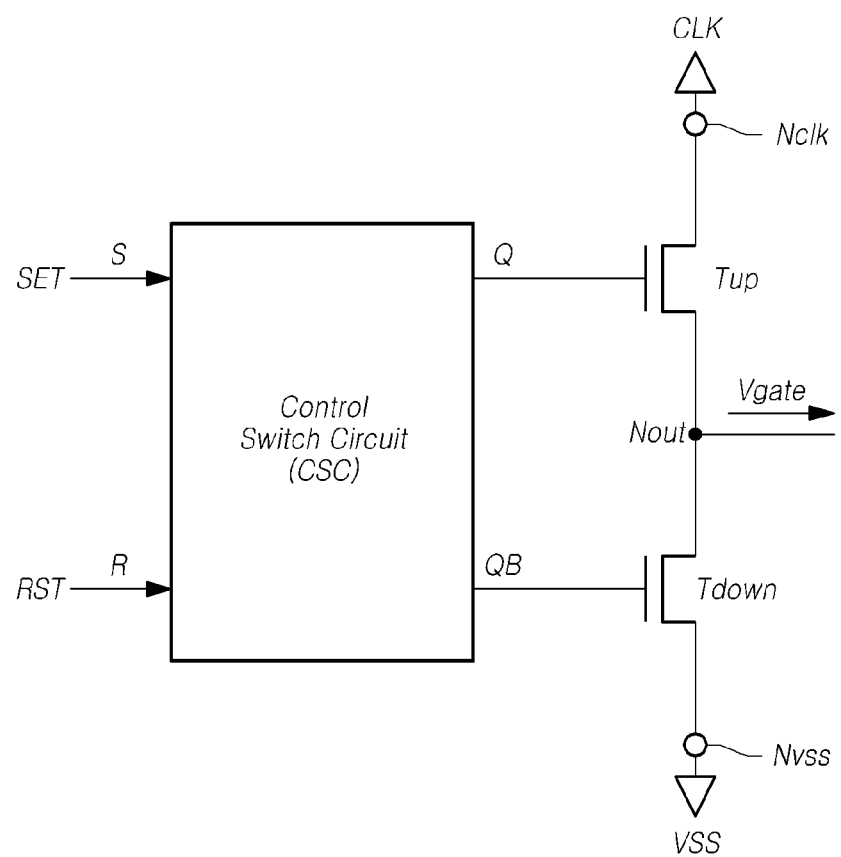
FIG. 5 is a diagram schematically illustrating a gate driving circuit disposed in a panel according to the embodiments of the present disclosure.

FIG. 5 is a diagram schematically illustrating a gate driving circuit GDC disposed in the panel PNL according to the embodiments of the present disclosure.

Referring to FIG. 5, each gate driving circuit GDC may include a pull-up transistor Tup, a pull-down transistor Tdown, a control switch circuit CSC, and the like.

The control switch circuit CSC is a circuit which controls the voltage of a node Q corresponding to the gate node of the pull-up transistor Tup and the voltage of a node QB corresponding to the gate node of the pull-down transistor Tdown and may include several switches (transistors).

The pull-up transistor Tup supplies agate signal Vgate corresponding to a first level voltage (e.g., a high level voltage VGH) to a gate line GL through agate signal output node Nout. The pull-down transistor Tdown supplies the gate signal Vgate corresponding to a second level voltage (e.g., a low level voltage VGL) to the gate line GL through the gate signal output node Nout. The pull-up transistor Tup and the pull-down transistor Tdown may be turned on at different timings.

The pull-up transistor Tup is electrically connected between a clock signal application node Nclk to which the clock signal CLK is applied and the gate signal output node Not electrically connected to the gate line GL and is turned on or off by the voltage of the node Q.

The gate node of the pull-up transistor Tup is electrically connected to the node Q. The drain node or the source node of the pull-up transistor Tup is electrically connected to the clock signal application node Nclk. The source node or the drain node of the pull-up transistor Tup is electrically connected to the gate signal output node Nout through which the gate signal Vgate is output.

The pull-up transistor Tup is turned on by the voltage of the node Q and outputs the gate signal Vgate, which has the high level voltage VGH in a high level period of the clock signal CLK, to the gate signal output node Nout.

The gate signal Vgate of the high level voltage VGH output to the gate signal output node Nout is supplied to the corresponding gate line GL.

The pull-down transistor Tdown is electrically connected between the gate signal output node Nout and a base voltage node Nvss and turned on or off by the voltage of the node QB.

The gate node of the pull-down transistor Tdown is electrically connected to the node QB. The drain node or the source node of the pull-down transistor Tdown is electrically connected to the base voltage node Nvss, and a base voltage VSS which is a constant voltage is applied to the drain node or the source node connected to the base voltage node Nvss. The source node or the drain node of the pull-down transistor Tdown is electrically connected to the gate signal output node Nout from which the gate signal Vgate is output.

The pull-down transistor Tdown is turned on by the voltage of the node QB and outputs the gate signal Vgate having the low level voltage VGL to the gate signal output node Nout. Accordingly, the gate signal Vgate having the low level voltage VGL may be supplied to the corresponding gate line GL through the gate signal output node Nout. As an example, the gate signal Vgate having the low level voltage VGL may be the base voltage VSS.

Meanwhile, the control switch circuit CSC may include two or more transistors and the like, and main nodes, such as the node Q, the node QB, a set node S (also referred to as "start node"), and a reset node R, are present therein. In some cases, an input node to which various voltages, such as a driving voltage VDD, are applied may be additionally present in the control switch circuit CSC.

In the control switch circuit CSC, the node Q is electrically connected to the gate node of the pull-up transistor Tup and is repeatedly charged and discharged.

In the control switch circuit CSC, the node QB is electrically connected to the gate node of the pull-down transistor Tdown and is repeatedly charged and discharged.

In the control switch circuit CSC, a set signal SET for instructing the corresponding gate driving circuit GDC to start gate driving is applied to the set node S.

The set signal SET applied to the set node S may be a start signal VST input from the outside of the gate driver GDR or a feedback signal (a carry signal) of agate signal Vgate output from a gate driving circuit GDC in a previous stage of the current gate driving circuit GDC.

A reset signal RST applied to the reset node R of the control switch circuit CSC may be a reset signal for simultaneously initializing gate driving circuits GDC in all stages or a carry signal input from another stage (a previous or following stage).

The control switch circuit CSC charges the node Q in response to the set signal SET and discharges the node Q in response to the reset signal RST. The control switch circuit CSC may include an inverter circuit to charge or discharge the node Q and the node QB at different timings.

As shown in FIG. 3, in each of the plurality of subpixels SP in the active region A/A of the panel PNL which is an OLED panel, the driving transistor DRT and the switching transistor O-SWT may be disposed.

As shown in FIG. 4, in each of the plurality of subpixels SP in the active region A/A of the panel PNL which is an LCD panel, the switching transistor L-SWT may be disposed.

As such, in each region of the plurality of subpixels SP in the active region of the panel PNL which may be an OLED panel or an LCD panel, the transistors DRT and O-SWT or the transistor L-SWT may be disposed.

Also, as shown in FIG. 2, when a gate driving circuit GDC is implemented as an GIP type, that is, when the gate driving circuit GDC is embedded in the panel PNL, various transistors (Tup, Tdown, and transistors in the control switch circuit CSC) included in the gate driving circuit GDC as shown in FIG. 5 may be disposed in the non-active region N/A which is an outer region of the active region A/A of the panel PNL.

Meanwhile, when an area occupied by various transistors TR disposed in the non-active region N/A increases, the area of the non-active region N/A may increase. This may lead to an increase in the bezel size of the display device, which is problematic. For this reason, various transistor structures in which an area occupied by the transistors TR is reduced will be described below.

Figure 6:
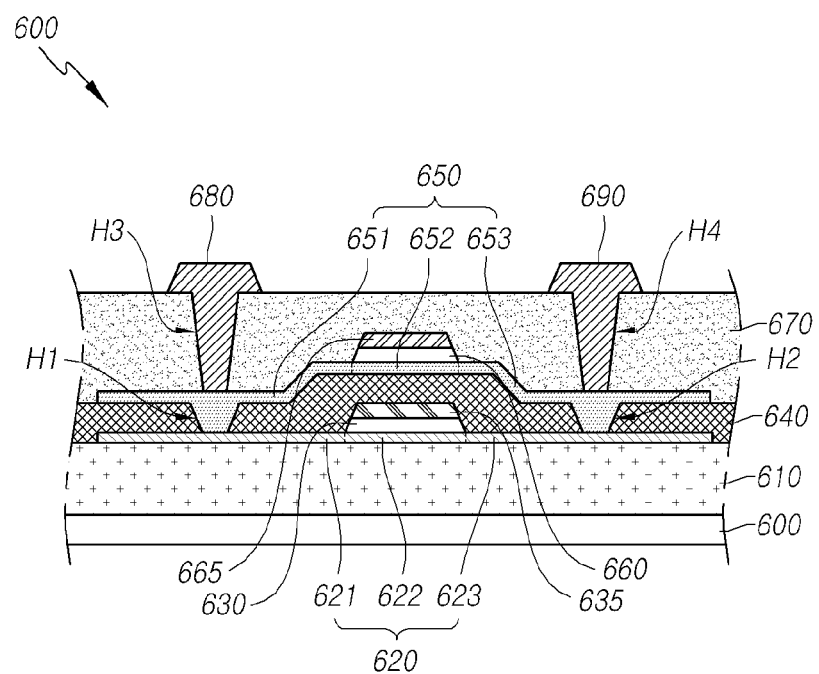
FIG. 6 is a cross-sectional view of transistors according to the embodiments of the present disclosure.
Figure 7:
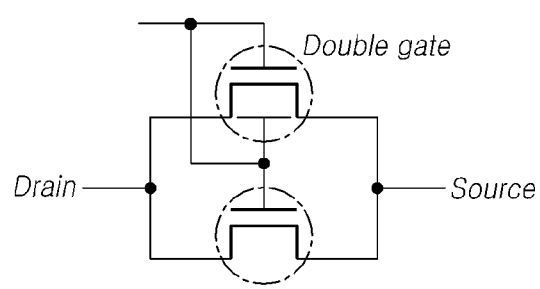
FIG. 7 shows an equivalent circuit of the transistors of FIG. 6 according to the embodiments of the present disclosure.

FIG. 6 is a cross-sectional view of transistors according to the embodiments of the present disclosure. FIG. 7 shows an equivalent circuit of the transistors of FIG. 6 according to the embodiments of the present disclosure.

Referring to FIG. 6, each of the transistors according to the embodiments of the present disclosure may include a first active layer 620, a first gate electrode 635, a second active layer 650, and a second gate electrode 665.

Specifically, according to the embodiment of the present disclosure, at least two transistors may be stacked on a substrate 600.

For example, one transistor (a transistor disposed in a lower part) may include a first active layer 620 and a first gate electrode 635. The first active layer 620 may include at least two regions which are made conductive, and each region may serve as one of the source electrode and the drain electrode.

Another transistor disposed on the above-described transistor (the transistor disposed in an upper part) may include a second active layer 650 and a second gate electrode 665. The second active layer 650 may include at least two regions which are made conductive, and each region may serve as one of the source electrode and the drain electrode.

At least one buffer layer 610 may be disposed on the substrate 600. In some cases, the buffer layer 610 may be omitted. Alternatively, the buffer layer 610 may have a structure in which a plurality of thin films are disposed. In this case, a plurality of inorganic layers may be stacked in the structure, but the present disclosure is not limited thereto.

The buffer layer 610 may be formed of an inorganic material such as silicon oxide (SiOx), silicon nitride (SiNx), or silicon oxynitride (SiON), but the present disclosure is not limited thereto.

When the buffer layer 610 includes multiple layers, at least two inorganic material layers among silicon oxide (SiOx), silicon nitride (SiNx), silicon oxynitride (SiON), etc. may be alternately disposed in the structure, but the present disclosure is not limited thereto.

In the following description, the buffer layer 610 is assumed to have a single layer structure.

The first active layer 620 may be disposed on the buffer layer 610.

The first active layer 620 may be one of various types of semiconductor layers.

As an example, the first active layer 620 may be formed of an oxide semiconductor. A material of the first active layer 620 is a metal-oxide semiconductor which may be an oxide of a metal such as zinc (Zn), indium (In), gallium (Ga), tin (Sn), and titanium (Ti), or a combination of a metal, such as zinc (Zn), indium (In), gallium (Ga), tin (Sn), and titanium (Ti), and an oxide thereof.

For example, the first active layer 620 may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), and an indium-zinc-tin oxide (IZTO).

Although the first active layer 620 is shown as a single layer in FIG. 6, the present disclosure is not limited thereto. For example, the first active layer 620 may include two or more layers.

A first gate insulating film 630 may be disposed on the first active layer 620. Also, the first gate insulating film 630 may be disposed to overlap a part of the first active layer 620.

The first gate insulating film 630 may be formed of an inorganic material such as silicon oxide (SiOx), silicon nitride (SiNx), or silicon oxynitride (SiON), but the present disclosure is not limited thereto.

A first gate electrode 635 may be disposed on the first gate insulating film 630.

The first gate electrode 635 may be formed of a metal such as aluminum (Al), silver (Ag), copper (Cu), molybdenum (Mo), chromium (Cr), tantalum (Ta), and titanium (Ti), or an alloy thereof.

Meanwhile, although the first gate electrode 635 is shown as a single layer in FIG. 6, the present disclosure is not limited thereto. For example, the first gate electrode 635 may have a multi-film structure of two or more layers. Examples of the multiple films may be a double film including a lower film such as titanium (Ti), tantalum (Ta), molybdenum (Mo), or ITO, and an upper film such as copper (Cu), a triple film of molybdenum (Mo)-aluminum (Al)-molybdenum (Mo), and the like. However, the first gate electrode 635 may be formed of various metals or conductive materials other than those mentioned above.

The first gate electrode 635 may be disposed to overlap a part of the first active layer 620.

At least one end of the first gate electrode 635 may be disposed to overlap at least one end of the first gate insulating film 630. Also, the first gate electrode 635 may be disposed to overlap a part of the first gate insulating film 630.

In other words, the first gate electrode 635 and the first gate insulating film 630 may be disposed to expose a part of the first active layer 620.

A region of the first active layer 620 which is exposed by (does not overlap) the first gate electrode 635 may have a higher electrical conductivity than a region of the first active layer 620 which overlaps the first gate electrode 635.

For example, the region of the first active layer 620 which does not overlap the first gate electrode 635 may be made conductive.

Then, the first active layer 620 may include a first channel region 622 overlapping the first gate electrode 635 and a first region 621 and a second region 623 which are disposed on both sides of the first channel region 622 with the first channel region 622 interposed therebetween.

The first channel region 622 may have a lower electrical conductivity than the first region 621 and the second region 623.

One of the first region 621 and the second region 623 may serve as the source electrode or the drain electrode of the transistor disposed in the lower part.

For example, the first region 621 may be the source electrode of the transistor disposed in the lower part, and the second region 623 may be the drain electrode of the transistor, but the present disclosure is not limited thereto. The first region 621 may be the drain electrode of the transistor, and the second region 623 may be the source electrode of the transistor.

A first insulating film 640 may be disposed on the first active layer 620, the first gate insulating film 630, and the first gate electrode 635. The first insulating film 640 may be disposed to cover the first gate insulating film 630 and the first gate electrode 635.

The first insulating film 640 may be formed of an inorganic material such as silicon oxide (SiOx), silicon nitride (SiNx), or silicon oxynitride (SiON), but the present disclosure is not limited thereto.

Although the first insulating film 640 is shown as a single layer in FIG. 6, the present disclosure is not limited thereto. For example, the first insulating film 640 may have a multi-film structure.

A second active layer 650 may be disposed on the first insulating film 640.

The second active layer 650 may be disposed to overlap the first active layer 620. Also, the second active layer 650 may be disposed to overlap the first gate electrode 635.

The second active layer 650 may be formed of an oxide semiconductor. A material of the second active layer 650 is a metal-oxide semiconductor which may be an oxide of a metal such as zinc (Zn), indium (In), gallium (Ga), tin (Sn), and titanium (T), or a combination of a metal, such as zinc (Zn), indium (In), gallium (Ga), tin (Sn), and titanium (Ti), and an oxide thereof.

For example, the second active layer 650 may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), and an indium-zinc-tin oxide (IZTO).

Although the second active layer 650 is shown as a single layer in FIG. 6, the present disclosure is not limited thereto. For example, the second active layer 650 may include two or more layers.

A second gate insulating film 660 may be disposed on the second active layer 650. Also, the second gate insulating film 660 may be disposed to overlap a part of the second active layer 650.

The second gate insulating film 660 may be formed of an inorganic material such as silicon oxide (SiOx), silicon nitride (SiNx), or silicon oxynitride (SiON), but the present disclosure is not limited thereto.

A second gate electrode 665 may be disposed on the second gate insulating film 660.

The second gate electrode 665 may be formed of a metal, such as aluminum (Al), silver (Ag), copper (Cu), molybdenum (Mo), chromium (Cr), tantalum (Ta), and titanium (Ti), or an alloy thereof.

Meanwhile, although the second gate electrode 665 is shown as a single layer in FIG. 6, the present disclosure is not limited thereto. For example, the second gate electrode 665 may have a multi-film structure of two or more layers. Examples of the multiple films may be a double film including a lower film, such as titanium (Ti), tantalum (Ta), molybdenum (Mo), or ITO, and an upper film such as copper (Cu), a triple film of molybdenum (Mo)-aluminum (Al)-molybdenum (Mo), and the like. However, the second gate electrode 665 may be formed of various metals or conductive materials other than those mentioned above.

The second gate electrode 665 may be disposed to overlap a part of the second active layer 650.

At least one end of the second gate electrode 665 may be disposed to overlap at least one end of the second gate insulating film 660. Also, the second gate electrode 665 may be disposed to overlap a part of the second gate insulating film 660.

In other words, the second gate electrode 665 and the second gate insulating film 660 may be disposed to expose a part of the second active layer 650.

A region of the second active layer 650 which is exposed by (does not overlap) the second gate electrode 665 may have a higher electrical conductivity than a region of the second active layer 650 which overlaps the second gate electrode 665.

For example, the region of the second active layer 650 which does not overlap the second gate electrode 665 may be made conductive.

Then, the second active layer 650 may include a second channel region 652 overlapping the second gate electrode 665 and a third region 651 and a fourth region 653 which are disposed on both sides of the second channel region 652 with the second channel region 652 interposed therebetween.

The second channel region 652 may have a lower electrical conductivity than the third region 651 and the fourth region 653.

One of the third region 651 and the fourth region 653 may serve as the source electrode or the drain electrode of the transistor disposed in the upper part.

For example, the third region 651 may be the source electrode of the transistor disposed in the upper part, and the fourth region 653 may be the drain electrode of the transistor, but the present disclosure is not limited thereto. The third region 651 may be the drain electrode of the transistor, and the fourth region 653 may be the source electrode of the transistor.

Meanwhile, the third region 651 of the second active layer 650 may be in contact with the first region 621 through a first hole H1 provided in the first insulating film 640. The fourth region 653 of the second active layer 650 may be in contact with the second region 623 of the first active layer 620 through a second hole H2 provided in the first insulating film 640.

A second insulating film 670 may be disposed on the second active layer 650, the second gate insulating film 660, and the second gate electrode 665. The second insulating film 670 may be disposed to cover the second gate insulating film 660 and the second gate electrode 665.

The second insulating film 670 may be formed of an inorganic material such as silicon oxide (SiOx), silicon nitride (SiNx), or silicon oxynitride (SiON), but the present disclosure is not limited thereto.

Although the second insulating film 670 is shown as a single layer in FIG. 6, the present disclosure is not limited thereto. For example, the second insulating film 670 may have a multi-film structure.

A first electrode 680 and a second electrode 690 may be disposed to be spaced apart from each other on the second insulating film 670.

The first electrode 680 may be in contact with the third region 651 of the second active layer 650 through a third hole H3 provided in the second insulating film 670. In other words, the first electrode 680 may be electrically connected to the third region 651 of the second active layer 650 and may also be electrically connected to the first region 621 of the first active layer 620.

The second electrode 690 may be in contact with the fourth region 653 of the second active layer 650 through a fourth hole H4 provided in the second insulating film 670. In other words, the second electrode 690 may be electrically connected to the fourth region 653 of the second active layer 650 and may also be electrically connected to the second region 623 of the first active layer 620.

A signal may be applied to at least one of the first electrode 680 and the second electrode 690.

When the first and second gate electrodes 635 and 665 of the transistors of FIG. 6 are turned on, the first channel region 622 of the first active layer 620 and the second channel region 652 of the second active layer 650 may be activated.

Referring to FIGS. 6 and 7, according to the embodiment of the present disclosure, the first and second gate electrodes 635 and 665 may be connected to the same gate node. Also, the drain electrode of a first transistor and the drain electrode of a second transistor may be connected to the same node, and the source electrode of the first transistor and the drain electrode of the second transistor may also be connected to the same node.

As shown in FIG. 7, the first and second gate electrodes 635 and 665 are connected to the same node and thus may be simultaneously turned on by one signal. For this reason, two channel regions may be activated by one gate signal. Accordingly, a current path may be increased, and the current capability of the transistors may be maximized.

The second transistor may perform an operation corresponding to a transistor having a double gate structure including the first gate electrode 635.

As shown in FIG. 6, the first active layer 620, the first gate electrode 635, the second active layer 650, and the second gate electrode 665 of the transistors are disposed to overlap each other so that an area occupied by the transistors in a display device can be reduced and electrical characteristics of the transistors can be improved.

Subsequently, the structure and circuit diagram of transistors according to other embodiments of the present disclosure will be described below with reference to FIGS. 8 to 11.

Figure 8:
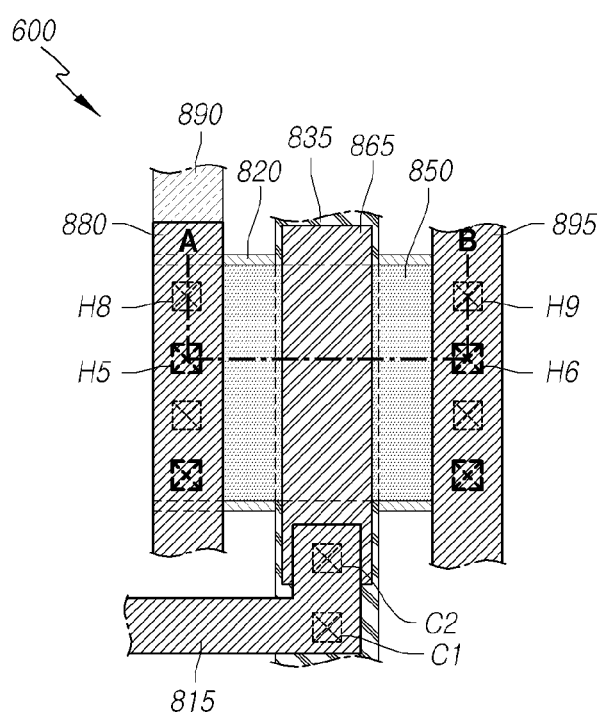
FIG. 8 is a plan view illustrating a partial region of a display device including transistors according to other embodiments of the present disclosure.
Figure 9:
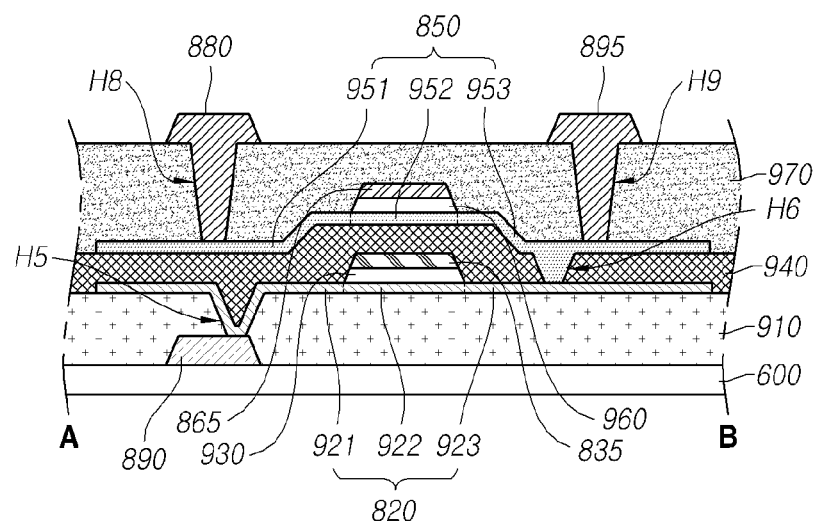
FIG. 9 is a cross-sectional view taken along line A-B of FIG. 8 according to the embodiments of the present disclosure.
Figure 10:
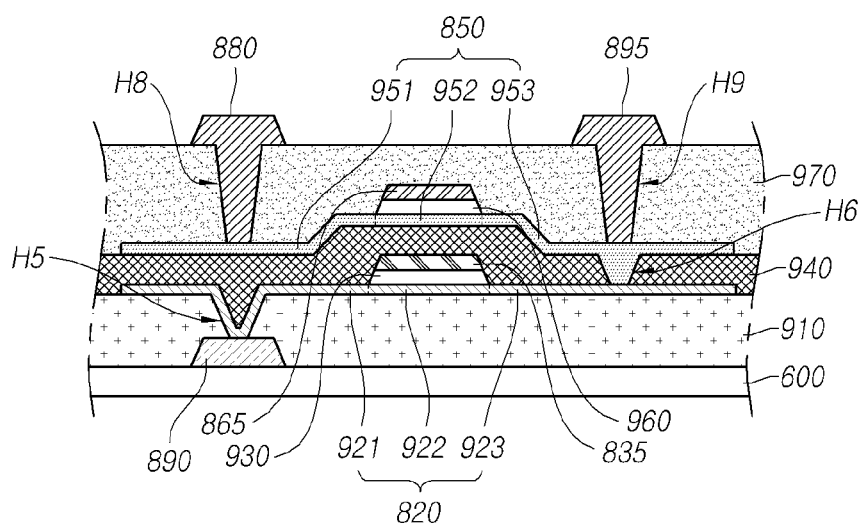
FIG. 10 is a cross-sectional view of transistors according to the other embodiments of the present disclosure.
Figure 11:
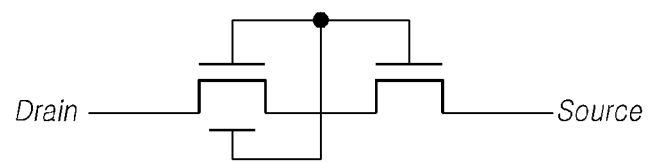
FIG. 11 shows an equivalent circuit of the transistors shown in FIGS. 8 to 10 according to the embodiments of the present disclosure.

FIG. 8 is a plan view illustrating a partial region of a display device including transistors according to the other embodiments of the present disclosure. FIG. 9 is a cross-sectional view taken along line A-B of FIG. 8 according to the embodiments of the present disclosure. FIG. 10 is a cross-sectional view of transistors according to the other embodiments of the present disclosure. FIG. 11 shows an equivalent circuit of the transistors shown in FIGS. 8 to 10 according to the embodiments of the present disclosure.

In the following description, details (a configuration, effects, etc.) which are the same as those of the above-described embodiments may be omitted.

Referring to FIGS. 8 and 9, the transistors according to the other embodiments may have a structure in which at least two transistors are stacked on a substrate 600 and each transistor is connected to one gate signal line.

For example, one transistor (a transistor disposed in a lower part) may include a first active layer 820 and a first gate electrode 835. The first active layer 820 may include at least two regions which are made conductive, and each region may serve as one of the source electrode and the drain electrode.

Also, another transistor disposed on the above-described transistor (a transistor disposed in an upper part) may include a second active layer 850 and a second gate electrode 865. The second active layer 850 may include at least two regions which are made conductive, and each region may serve as one of the source electrode and the drain electrode.

Specifically, a third electrode 890 (or a first conductive layer) may be disposed on the substrate 600. As shown in FIG. 8, the third electrode 890 may have a line shape in a plan view, but the present disclosure is not limited thereto. For example, the third electrode 890 may have an island shape.

Although not shown in FIGS. 8 and 9, a buffer layer may be disposed between the third electrode 890 and the substrate 600.

Meanwhile, the third electrode 890 may be formed of a metal, such as aluminum (Al), silver (Ag), copper (Cu), molybdenum (Mo), chromium (Cr), tantalum (Ta), and titanium (Ti), an alloy thereof, or the like. Although the third electrode 890 is shown as a single layer in FIG. 9, the present disclosure is not limited thereto. For example, the third electrode 890 may have a multi-film structure of two or more layers.

A first insulating film 910 may be disposed on the third electrode 890.

The first insulating film 910 may be formed of an inorganic material such as silicon oxide (SiOx), silicon nitride (SiNx), or silicon oxynitride (SiON), but the present disclosure is not limited thereto. Although the first insulating film 910 is shown as a single layer in FIG. 9, the present disclosure is not limited thereto. For example, the first insulating film 910 may have a multi-film structure.

The first active layer 820 may be disposed on the first insulating film 910.

As shown in FIGS. 8 and 9, the third electrode 890 of the transistor disposed in the lower part may be disposed to overlap a part of the first active layer 820.

A first gate insulating film 930 may be disposed on the first active layer 820, and the first gate electrode 835 may be disposed on the first gate insulating film 930.

As shown in FIG. 8, the first gate electrode 835 may have a line shape, but the present disclosure is not limited thereto.

Also, as shown in FIGS. 8 and 9, the first gate electrode 835 may be disposed to overlap a part of the first active layer 820.

The first active layer 820 may include a first channel region 922 overlapping the first gate electrode 835 and a first region 921 and a second region 923 which are disposed on both sides of the first channel region 922 with the first channel region 922 interposed therebetween.

The first channel region 922 may have a lower electrical conductivity than the first region 921 and the second region 923.

One of the first region 921 and the second region 923 may serve as the source electrode or the drain electrode of the transistor disposed in the lower part.

For example, the first region 921 may be the source electrode of the transistor disposed in the lower part, and the second region 923 may be the drain electrode of the transistor, but the present disclosure is not limited thereto. The first region 921 may be the drain electrode of the transistor, and the second region 923 may be the source electrode of the transistor.

The first region 921 of the first active layer 820 may be in contact with the third electrode 890 through a fifth hole H5 provided in the first insulating film 910. In other words, the first region 921 of the first active layer 820 may be electrically connected to the third electrode 890.

A second insulating film 940 may be disposed on the first active layer 820, the first gate insulating film 930, and the first gate electrode 835. The second insulating film 940 may be disposed to cover the first gate insulating film 930 and the first gate electrode 835.

The second active layer 850 may be disposed on the second insulating film 940.

As shown in FIGS. 8 and 9, a part of the second active layer 850 may be disposed to overlap the third electrode 890 and the first gate electrode 835. Also, the second active layer 850 may be disposed to overlap a part or all of the first active layer 820.

A second gate insulating film 960 may be disposed on the second active layer 850, and the second gate electrode 865 may be disposed on the second gate insulating film 960.

Also, as shown in FIGS. 8 and 9, the second gate electrode 865 may be disposed to overlap a part of the second active layer 850.

The second active layer 850 may include a second channel region 952 overlapping the second gate electrode 865 and a third region 951 and a fourth region 953 which are disposed on both sides of the second channel region 952 with the second channel region 952 interposed therebetween.

The second channel region 952 may have a lower electrical conductivity than the third region 951 and the fourth region 953.

One of the third region 951 and the fourth region 953 may serve as the source electrode or the drain electrode of the transistor disposed in the upper part.

For example, the third region 951 may be the source electrode of the transistor disposed in the upper part, and the fourth region 953 may be the drain electrode of the transistor, but the present disclosure is not limited thereto. The third region 951 may be the drain electrode of the transistor, and the fourth region 953 may be the source electrode of the transistor.

The fourth region 953 of the second active layer 850 may be in contact with the second region 923 of the first active layer 820 through a sixth hole H6 provided in the second insulating film 940. In other words, the fourth region 953 of the second active layer 850 is in contact with the second region 923 of the first active layer 820 so that the second active layer 850 and the first active layer 820 may be electrically connected.

A third insulating film 970 may be disposed on the second active layer 850, the second gate insulating film 960, and the second gate electrode 865. The third insulating film 970 may be disposed to cover the second gate insulating film 960 and the second gate electrode 865.

A fourth electrode 880 may be disposed on the third insulating film 970. As shown in FIG. 8, the fourth electrode 880 may have a line shape in a plan view, but the present disclosure is not limited thereto. For example, the fourth electrode 880 may have an island shape.

As shown in FIGS. 8 and 9, the fourth electrode 880 may be disposed to overlap the third electrode 890. Also, the fourth electrode 880 may also overlap a part of the first active layer 820 and a part of the second active layer 850.

In another aspect, the fourth electrode 880 may overlap the second active layer 850 in a region corresponding to a region in which the third electrode 890 overlaps the first active layer 820.

Meanwhile, the fourth electrode 880 may be formed of a metal, such as aluminum (Al), silver (Ag), copper (Cu), molybdenum (Mo), chromium (Cr), tantalum (Ta), and titanium (Ti), an alloy thereof, or the like. Although the fourth electrode 880 is shown as a single layer in FIG. 9, the present disclosure is not limited thereto. For example, the fourth electrode 880 may have a multi-film structure of two or more layers.

The fourth electrode 880 may be in contact with the third region 951 of the second active layer 850 through an eighth hole H8 provided in the third insulating film 970. In other words, the fourth electrode 880 may be electrically connected to the third region 951 of the second active layer 850.

Also, a fifth electrode 895 may be disposed on the third insulating film 970 to be spaced apart from the fourth electrode 880.

The fifth electrode 895 may be in contact with the fourth region 953 of the second active layer 850 through a ninth hole H9 provided in the third insulating film 970.

Although not shown in the drawings, the fifth electrode 895 may be electrically connected to another adjacent transistor which is disposed in the display panel.

Referring to FIGS. 8 and 9, the third electrode 890 and the fourth electrode 880 may be disposed to overlap each other. The third electrode 890 may be connected to the first active layer 820 through the fifth hole H5, and the fourth electrode 880 may be electrically connected to the second active layer 850 through the eighth hole H8.

The first insulating film 910 may have at least one fifth hole H5, and the third insulating film 970 may also have at least one eighth hole H8.

In this case, as shown in FIGS. 8 and 9, the fifth hole H5 and the eighth hole H8 may not overlap each other.

Since the fifth hole H5 and the eighth hole H8 do not overlap each other, it is possible to prevent at least one of the active layers 820 and 850 from being damaged in a process of forming the fifth hole H5 and the eighth hole H8.

Also, the first active layer 820, the second active layer 850, and the fifth electrode 895 may be disposed to overlap each other at least partially so that the fourth region 953 of the second active layer 850 may be electrically connected to the second region 923 of the first active layer 820 through the sixth hole H6 and the fifth electrode 895 may be connected to the fourth region 953 of the second active layer 850 through the ninth hole H9.

The second insulating film 940 may have at least one sixth hole H6, and the third insulating film 970 may have at least one ninth hole H9.

In this case, as shown in FIGS. 8 and 9, the sixth hole H6 and the ninth hole H9 may not overlap each other.

Since the sixth hole H6 and the ninth hole H9 do not overlap each other, it is possible to prevent at least one of the active layers 820 and 850 from being damaged in a process of forming the sixth hole H6 and the ninth hole H9.

However, the present disclosure is not limited thereto, and as shown in FIG. 10, the fifth hole H5 and the eighth hole H8 may overlap each other, and the sixth hole H6 and the ninth hole H9 may overlap each other.

Meanwhile, referring to FIGS. 8 and 11, the transistors according to the other embodiments of the present disclosure may be electrically connected to the same gate signal line 815.

Specifically, each of the first gate electrode 835 and the second gate electrode 865 may be electrically connected to the single gate signal line 815. The first gate electrode 835 may be connected to the gate signal line 815 through a first contact hole C1, and the second gate electrode 865 may be connected to the gate signal line 815 through a second contact hole C2.

In other words, as shown in FIG. 11, the first gate electrode 835 and the second gate electrode 865 may be connected to the same gate node.

Also, the first active layer 820 and the second active layer 850 are electrically connected through the sixth hole H6 so that the first channel region 922 and the second channel region 952 may be connected in series. In this case, the first active layer 820 including the first channel region 922 may be disposed to ensure electrical stability of the second active layer 850.

For example, when the first and second gate electrodes 835 and 865 are turned off, the first active layer 820 may prevent the second channel region 952 of the second active layer 850 from being activated even if a signal is applied to the third electrode 890.

In the above-described structure, the one transistor may include the first gate electrode 835 and the first active layer 820. Also, one of the third electrode 890 and the second region 923 of the first active layer 820 which is made conductive serves as the source electrode, and the other serves as the drain electrode. In this way, the one transistor (hereinafter "first transistor") may be configured.

Meanwhile, the third electrode 890 disposed on the substrate 600 may prevent light from being incident on the first active layer 820 so that characteristics of the first active layer 820 may not be changed.

Also, the other transistor may include the second gate electrode 865 and the second active layer 850, one of the fourth electrode 880 and the fourth region 953 of the second active layer 850 which is made conductive serves as the source electrode, and the other serves as the drain electrode so that the other transistor (hereinafter "second transistor") may be configured.

As such, the first transistor and the second transistor are disposed to overlap in a height direction of the substrate 600 so that an area horizontally occupied by the transistors may be reduced in the display panel.

Therefore, when the first transistor and the second transistor are present in the non-active region of the display panel, it is possible to reduce the area of the non-active region by stacking the first transistor and the second transistor in a vertical direction.

Subsequently, a structure of transistors according to still other embodiments of the present disclosure will be described below with reference to FIGS. 12 and 13.

Figure 12:
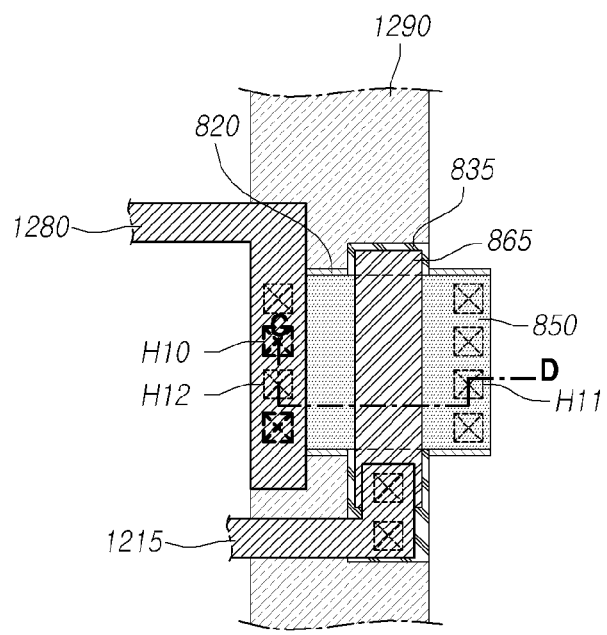
FIG. 12 is a plan view illustrating a partial region of a display device including transistors according to still other embodiments of the present disclosure.

FIG. 12 is a plan view illustrating a partial region of a display device including transistors according to still other embodiments of the present disclosure. FIG. 13 is a cross-sectional view taken along line C-D of FIG. 12 according to the embodiments of the present disclosure.

In the following description, details (a configuration, effects, etc.) which are the same as those of the above-described embodiments may be omitted.

Figure 13:
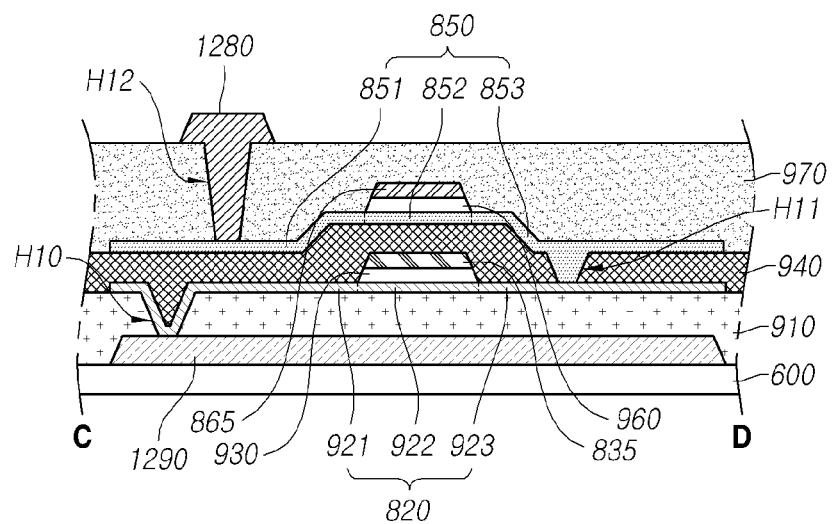
FIG. 13 is a cross-sectional view taken along line C-D of FIG. 12 according to the embodiments of the present disclosure.

Referring to FIGS. 12 and 13, the transistors according to still other embodiments may have a structure in which at least two transistors are stacked on a substrate 600 and each transistor is connected to one gate signal line 1215 (where the gate signal line is a line for supplying a signal to a gate electrode).

A sixth electrode 1290 may be disposed on the substrate 600. The sixth electrode 1290 may be disposed at a position corresponding to the third electrode 890 shown in FIGS. 8 and 9 but is different from the third electrode 890 in that the sixth electrode 1290 is disposed to overlap a first channel region 922 of a first active layer 820.

Specifically, the sixth electrode 1290 may overlap a first region 921 and the first channel region 922. In some cases, as shown in FIG. 13, the sixth electrode 1290 may overlap the first region 921, the first channel region 922, and a second region 923 of the first active layer 820.

Also, the sixth electrode 1290 may be disposed to overlap a first gate electrode 835 and a second gate electrode 865.

Although the sixth electrode 1290 may be a line to which a clock signal CLK is applied, the present disclosure is not limited thereto.

The first active layer 820 may be in contact with the sixth electrode 1290 through a tenth hole H10 provided in a first insulating film 910.

A second active layer 850 disposed on the first gate electrode 835 may be in contact with the first active layer 820 through an eleventh hole H11 provided in a second insulating film 940. Specifically, a fourth region 853 of the second active layer 850 may be electrically connected to the second region 923 of the first active layer 820 through the eleventh hole H11.

A third insulating film 970 may be disposed on the second gate electrode 865 disposed on the second active layer 850, and a seventh electrode 1280 may be disposed on the third insulating film 970.

The seventh electrode 1280 may be in contact with a third region 851 of the second active layer 850 through a twelfth hole H12 provided in the third insulating film 970.

In the structure shown in FIGS. 12 and 13, one transistor may include the first gate electrode 835 and the first active layer 820. Then, one of the first region 921 of the first active layer 820 and the second region 923 of the first active layer 820 serves as the source electrode, and the other serves as the drain electrode so that the one transistor (hereinafter "first transistor") may be configured.

Also, the other transistor may include the second gate electrode 865 and the second active layer 850. One of the third region 851 of the second active layer 850 and the fourth region 853 of the second active layer 850 serves as the source electrode, and the other serves as the drain electrode so that the other transistor (hereinafter "second transistor") may be configured.

As such, the first transistor and the second transistor are disposed to overlap in a height direction of the substrate 600 so that an area horizontally occupied by the transistors may be reduced in the display panel.

Therefore, when the first transistor and the second transistor are present in the non-active region of the display panel, it is possible to reduce the area of the non-active region by stacking the first transistor and the second transistor in a vertical direction.

Subsequently, signal waveforms applied to the transistors shown in FIGS. 12 and 13 and equivalent circuits of the transistors will be described below with reference to FIGS. 14 and 15.

Figure 14:
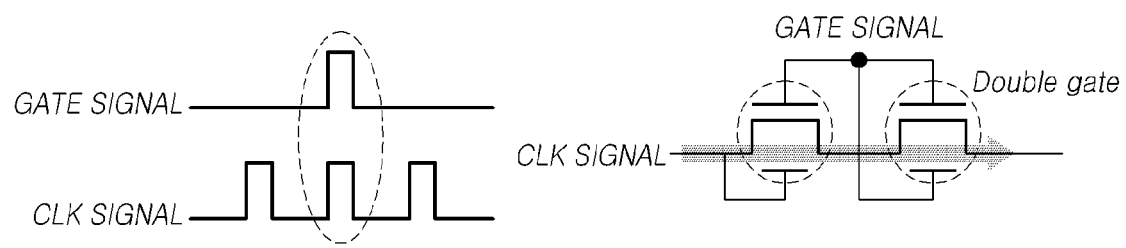
FIGS. 14 and 15 show signal waveforms applied to the transistors shown in FIGS. 12 and 13 and equivalent circuits of the transistors according to the embodiments of the present disclosure.
Figure 15:
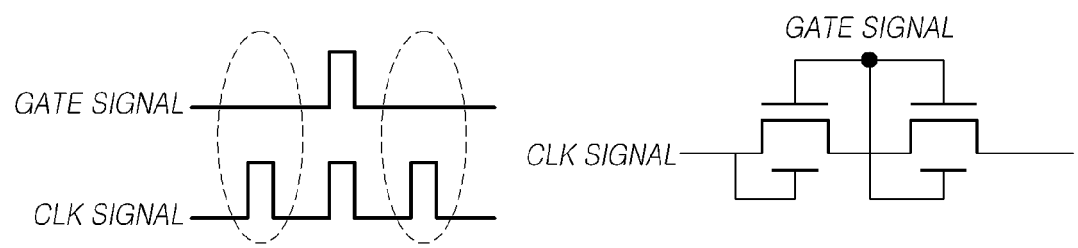

FIGS. 14 and 15 show signal waveforms applied to the transistors shown in FIGS. 12 and 13 and equivalent circuits of the transistors according to the embodiments of the present disclosure.

First, referring to FIG. 14, when a clock signal CLK is applied to the sixth electrode 1290 to apply the clock signal CLK to the transistors of FIG. 13, high-level periods are present due to the clock signal CLK, and when a high-level period of the clock signal CLK corresponds to a high-level period of a gate signal, the first and second transistors shown in FIGS. 13 and 14 may be turned on.

In this case, the second transistor may perform an operation corresponding to a transistor having a double gate structure including the first gate electrode 835.

Specifically, when the clock signal CLK is applied to the sixth electrode 1290 shown in FIGS. 13 and 14 and the first and second gate electrodes 835 and 865 connected to the same node are turned on, the signal applied to the sixth electrode 1290 may be passed through the first active layer 820 and the second active layer 850 and output through the seventh electrode 1280.

As shown in FIG. 15, even when the clock signal CLK is applied to the sixth electrode 1290, the gate signal may not be applied. In this case, the first and second gate electrodes 835 and 865 are turned off. Consequently, the signal applied to the sixth electrode 1290 may not be transferred to the first and second active layers 820 and 850.

Meanwhile, even when the first gate electrode 835 is turned off, the clock signal CLK applied to the sixth electrode 1290 may be transferred to the first active layer 820. In this case, however, the second gate electrode 865 is also turned off, and thus the signal may not be transferred to the second active layer 850.

In other words, since the first gate electrode 835 and the second gate electrode 865 are simultaneously turned off, the signal applied to the sixth electrode 1290 may not be transferred to the seventh electrode 1280 which is an output terminal so that a leakage current may be reduced.

In the display device according to embodiments of the present disclosure, at least two transistors are disposed to overlap each other and electrically connected so that a leakage current may be reduced.

The arrangement of transistors according to yet other embodiments of the present disclosure will be described below with reference to FIGS. 16 to 18.

Figure 16:
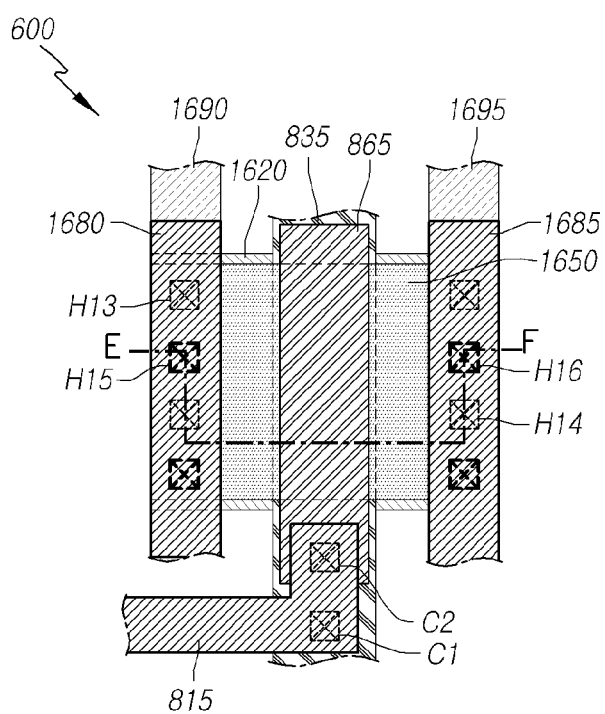
FIG. 16 is a plan view illustrating a partial region of a display device including transistors according to yet other embodiments of the present disclosure.

FIG. 16 is a plan view illustrating a partial region of a display device including transistors according to yet other embodiments of the present disclosure. FIG. 17 is a cross-sectional view taken along line E-F of FIG. 16 according to the embodiments of the present disclosure. FIG. 18 shows an equivalent circuit of the transistors according to yet other embodiments of the present disclosure.

In the following description, details (a configuration, effects, etc.) which are the same as those of the above-described embodiments may be omitted.

Figure 17:
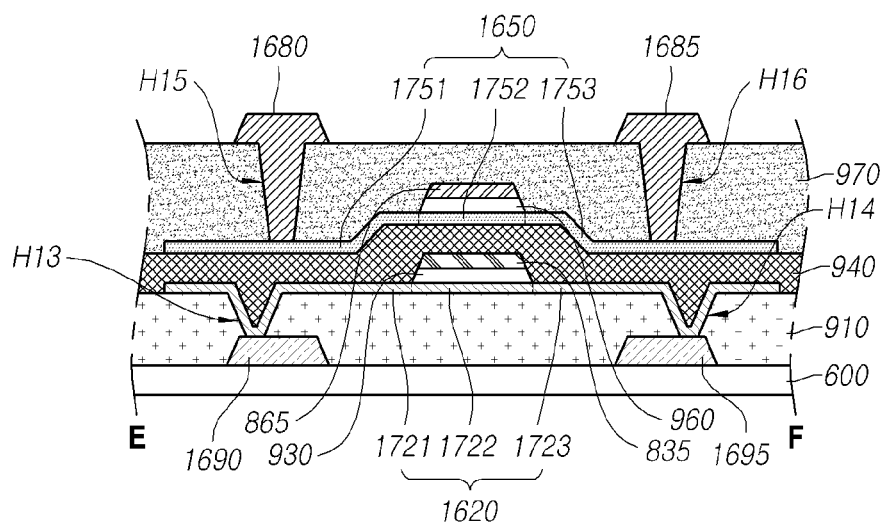
FIG. 17 is a cross-sectional view taken along line E-F of FIG. 16 according to the embodiments of the present disclosure.

Referring to FIGS. 16 and 17, the transistors according to still other embodiments may have a structure in which at least two transistors are stacked on a substrate 600 and each transistor is connected to one gate signal line 815 (where the gate signal line is a line for supplying a signal to a gate electrode).

For example, a first transistor and a second transistor may be disposed on the substrate.

The first transistor may include a first active layer 1620 and a first gate electrode 835. One of a first region 1721 and a second region 1723 of the first active layer 1620 which are made conductive may be the source electrode of the first transistor, and the other may be the drain electrode of the first transistor.

Under the first transistor, an eighth electrode 1690 and a ninth electrode 1695 may be disposed to be spaced apart from each other. The eighth electrode 1690 and the ninth electrode 1695 may prevent light from being incident on the first active layer 1620 so that characteristics of the first active layer 1620 may not be changed.

A first insulating film 910 may be disposed on the eighth electrode 1690 and the ninth electrode 1695.

A first active layer 1620 including a first region 1721, a first channel region 1722, and a second region 1723 may be disposed on the first insulating film 910.

The first region 1721 of the first active layer 1620 may be in contact with the eighth electrode 1690 through a thirteenth hole H13 provided in the first insulating film 910. The second region 1723 of the first active layer 1620 may be in contact with the ninth electrode 1695 through a fourteenth hole H14 provided in the first insulating film 910.

A first gate insulating film 930 may be disposed on the first active layer 1620, and the first gate electrode 835 may be disposed on the first gate insulating film 930.

The second transistor may include a second active layer 1650 and a second gate electrode 865. One of a third region 1751 and a fourth region 1753 of the second active layer 1650 which are made conductive may be the source electrode of the second transistor, and the other may be the drain electrode of the second transistor.

The second active layer 1650 of the second transistor may be disposed on a second insulating film 940 disposed on the first gate electrode 835. The second active layer 1650 may include the third region 1751, a second channel region 1752, and the fourth region 1753.

A second gate insulating film 960 may be disposed on the second active layer 1650, and the second gate electrode 865 may be disposed on the second gate insulating film 960.

A third insulating film 970 may be disposed on the second active layer 1650, the second gate insulating film 960, and the second gate electrode 865.

On the third insulating film 970, a tenth electrode 1680 and an eleventh electrode 1685 may be disposed to be spaced apart from each other.

The tenth electrode 1680 may be in contact with the third region 1751 of the second active layer 1650 through a fifteenth hole H15 provided in the third insulating film 970. The eleventh electrode 1685 may be in contact with the fourth region 1753 of the second active layer 1650 through a sixteenth hole H16 provided in the third insulating film 970.

As shown in FIGS. 16 and 17, the eighth electrode 1690 of the first transistor and the tenth electrode 1680 of the second transistor may overlap each other.

Also, the ninth electrode 1695 of the first transistor and the eleventh electrode 1685 of the second transistor may overlap each other.

The eighth electrode 1690 and the tenth electrode 1680 may be the drain electrodes of the first and second transistors respectively, and the ninth electrode 1695 and the eleventh electrode 1685 may be the source electrodes of the first and second transistors respectively, but the present disclosure is not limited thereto.

The first active layer 1620 and the second active layer 1650 may be disposed to overlap the eighth to eleventh electrodes 1690, 1695, 1680, and 1685.

Figure 18:
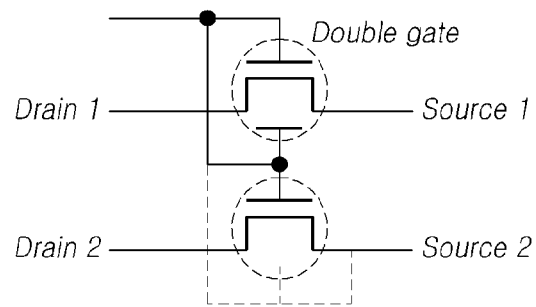
FIG. 18 shows an equivalent circuit of the transistors according to yet other embodiments of the present disclosure.

Meanwhile, referring to FIGS. 16 and 18, the transistors according to yet other embodiments of the present disclosure may be electrically connected to the same gate signal line 815.

In other words, as shown in FIG. 18, the first gate electrode 835 and the second gate electrode 865 may be connected to the same gate node. Also, the first active layer 1620 and the second active layer 1650 are spaced apart from each other by the second insulating film 940 interposed therebetween so that the first channel region 1722 and the second channel region 1752 may be connected in parallel.

Accordingly, it is possible to reduce resistance of the first and second channel regions 1722 and 1752.

As described above, it is possible to adjust electrical characteristics of a plurality of transistors according to still other embodiments of the present disclosure through a connection structure of a channel region of each transistor.

Also, since the first gate electrode 835 and the second gate electrode 865 are connected to the same node, the second transistor may perform an operation corresponding to a transistor having a double gate structure including the first gate electrode 835 disposed under the second active layer 1650.

In other words, since the first and second gate electrodes 835 and 865 are connected to the same gate signal line 815, the same signal is applied to the first and second gate electrodes 835 and 865, and when the second gate electrode 865 is turned off, the first gate electrode 835 may also be turned off. As such, the double gates which overlap each other are turned off so that no leakage current may flow through the second active layer 1650.

In addition, the first transistor and the second transistor are disposed to overlap in a height direction of the substrate 600 so that an area horizontally occupied by the transistors may be reduced in the display panel.

According to embodiments of the present disclosure, it is possible to provide a thin film transistor (TFT) array substrate having a structure in which an area horizontally occupied by transistors is reduced by stacking at least two transistors on a substrate in a direction perpendicular to the substrate and provide an electronic device including the TFT array substrate.

According to embodiments of the present disclosure, it is possible to provide a TFT array substrate having a structure in which the gate electrodes of at least two transistors are connected to nodes corresponding to each other so that a leakage current can be reduced and provide an electronic device including the TFT array substrate.

According to embodiments of the present disclosure, it is possible to provide a TFT array substrate having a structure in which a contact hole formed for an electrical connection between elements included in at least two transistors overlapping each other is property disposed to prevent damage to the elements included in the transistors during the fabrication process and an electronic device including the TFT array substrate.

The above description has been presented to enable any person skilled in the art to make and use the technical idea of the present disclosure and has been provided in the context of a particular application and its requirements. Various modifications, additions, and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An electronic device comprising:
   a panel; and
   a driving circuit configured to drive the panel,
   wherein a transistor disposed in the panel comprises:
   a first active layer disposed on a substrate, wherein the first active layer comprises a first channel region overlapping a first gate electrode and a first region and a second region which are made conductive and spaced apart from each other with the first channel region interposed therebetween;
   a first gate insulating film disposed on the first active layer to overlap a part of the first active layer;
   the first gate electrode disposed on the first gate insulating film to overlap a part of the first active layer;
   a first insulating film disposed on the first gate electrode;
   a second active layer disposed on the first insulating film to overlap the first active layer and the first gate electrode, wherein the second active layer comprises a second channel region overlapping a second gate electrode and a third region and a fourth region which are made conductive and spaced apart from each other with the second channel region interposed therebetween;
   a second gate insulating film disposed on the second active layer; and
   the second gate electrode disposed on the second gate insulating film to overlap a part of the second active layer, and
   the first gate electrode and the second gate electrode overlap each other,
   wherein a part of at least one of the third region or the fourth region of the second active layer extends from a bottom surface of the at least one of the third region or the fourth region toward at least one of the first region or the second region of the first active layer to contact the at least one of the first region or the second region through a contact hole in the first insulating film.

2. The electronic device of claim 1, wherein the first insulating film comprises:
   a first hole exposing an upper surface of the first region of the first active layer; and
   a second hole exposing an upper surface of the second region of the first active layer,
   wherein the third region of the second active layer is in contact with the first region of the first active layer through the first hole, and
   wherein the fourth region of the second active layer is in contact with the second region of the first active layer through the second hole.

3. The electronic device of claim 2, further comprising:
   a second insulating film disposed on the second gate electrode; and a first electrode and a second electrode disposed to be spaced apart from each other on the second insulating film, wherein the second insulating film comprises:

a third hole exposing an upper surface of the third region of the second active layer; and a fourth hole exposing an upper surface of the fourth region of the second active layer, the first electrode is in contact with the third region of the second active layer through the third hole, and the second electrode is in contact with the fourth region of the second active layer through the fourth hole.

4. The electronic device of claim 1, further comprising:

a third insulating film disposed under the first active layer; and a first conductive layer disposed under the third insulating film.

5. The electronic device of claim 4, wherein the third insulating film comprises a fifth hole exposing an upper surface of the first conductive layer, and the first region of the first active layer is in contact with the first conductive layer through the fifth hole.

6. The electronic device of claim 4, wherein the first insulating film comprises a sixth hole exposing an upper surface of the second region of the first active layer, and the fourth region of the second active layer is in contact with the first active layer through the sixth hole.

7. The electronic device of claim 4, further comprising a third electrode on a second insulating film disposed on the second gate electrode, and the third electrode is in contact with the third region of the second active layer through a seventh hole provided in the second insulating film.

8. The electronic device of claim 7, further comprising a fourth electrode disposed on the second insulating film to be spaced apart from the third electrode, wherein the fourth electrode is in contact with the fourth region of the second active layer through an eighth hole provided in the second insulating film.

9. The electronic device of claim 8, wherein the fourth electrode is electrically connected to another adjacent transistor which is disposed on the substrate.

10. The electronic device of claim 4, wherein the first conductive layer does not overlap the first channel region of the first active layer and the second region of the first active layer.

11. The electronic device of claim 4, wherein the first conductive layer overlaps the first region, the first channel region, and the second region of the first active layer.

12. The electronic device of claim 11, wherein a clock signal is applied to the first conductive layer.

13. The electronic device of claim 4, further comprising a second conductive layer disposed to be coplanar with the first conductive layer and spaced apart from the first conductive layer.

14. The electronic device of claim 13, wherein the second conductive layer overlaps the second region of the first active layer and does not overlap the first channel region of the first active layer and the first region of the first active layer.

15. The electronic device of claim 13, wherein the third insulating film comprises a ninth hole exposing an upper surface of the second conductive layer, and the second region of the first active layer is in contact with the second conductive layer through the ninth hole.

16. The electronic device of claim 13, further comprising a fifth electrode and a sixth electrode disposed to be spaced apart from each other on a second insulating film disposed on the second gate electrode, the fifth electrode is in contact with the third region of the second active layer through a tenth hole provided in the second insulating film, and the sixth electrode is in contact with the fourth region of the second active layer through an eleventh hole provided in the second insulating film.

17. The electronic device of claim 1, wherein the first gate electrode and the second gate electrode are electrically connected to a same node.

18. A thin film transistor array substrate comprising:

a substrate;

a first active layer disposed on the substrate, wherein the first active layer comprises a first channel region overlapping a first gate electrode and a first region and a second region which are made conductive and spaced apart from each other with the first channel region interposed therebetween;

a first gate insulating film disposed on the first active layer;

the first gate electrode disposed on the first gate insulating film to overlap a part of the first active layer;

a first insulating film disposed on the first gate electrode;

a second active layer disposed on the first insulating film to overlap the first active layer and the first gate electrode, wherein the second active layer comprises a second channel region overlapping a second gate electrode and a third region and a fourth region which are made conductive and spaced apart from each other with the second channel region interposed therebetween;

a second gate insulating film disposed on the second active layer; and the second gate electrode disposed on the second gate insulating film to overlap a part of the second active layer, wherein the first gate electrode and the second gate electrode overlap each other, wherein a part of at least one of the third region or the fourth region of the second active layer extends from a bottom surface of the at least one of the third region or the fourth region toward at least one of the first region or the second region of the first active layer to contact the at least one of the first region or the second region through a contact hole in the first insulating film.

* * * * *